US006842026B2

(12) United States Patent
Yamaoka et al.

(10) Patent No.: US 6,842,026 B2
(45) Date of Patent: *Jan. 11, 2005

(54) INSPECTING APPARATUS AND INSPECTING METHOD FOR CIRCUIT BOARD

(75) Inventors: Shuji Yamaoka, Fukuyama (JP); Shogo Ishioka, Fukayasu-gun (JP)

(73) Assignee: OHT, Inc., Fukayasu-gun (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/169,750

(22) PCT Filed: Nov. 15, 2001

(86) PCT No.: PCT/JP01/09993

§ 371 (c)(1), (2), (4) Date: Jul. 17, 2002

(87) PCT Pub. No.: WO02/41019

PCT Pub. Date: May 23, 2002

(65) Prior Publication Data

US 2003/0001562 A1 Jan. 2, 2003

(30) Foreign Application Priority Data

Nov. 17, 2000 (JP) .................................... 2000-351451

(51) Int. Cl.[7] ........................................ G01R 31/02

(52) U.S. Cl. ................................ 324/761; 324/754

(58) Field of Search ...................... 324/761, 537–538, 324/754, 158.1

(56) References Cited

U.S. PATENT DOCUMENTS 5,017,864 A * 5/1991 Kaida et al. ................ 324/754
5,254,953 A * 10/1993 Crook et al. ................ 324/537
5,686,994 A * 11/1997 Tokura ........................ 356/394
5,757,193 A * 5/1998 Yu et al. ...................... 324/501
5,969,530 A * 10/1999 Yamashita .................. 324/537
6,097,202 A * 8/2000 Takahashi ................... 324/537
6,160,409 A * 12/2000 Nurioka ...................... 324/754
6,201,398 B1 * 3/2001 Takada ....................... 324/537
6,456,102 B1 * 9/2002 Mori et al. ................. 324/765
6,710,607 B2 * 3/2004 Fujii et al. .................. 324/538
2002/0135390 A1 * 9/2002 Fujii et al. .................. 324/761
2002/0180455 A1 * 12/2002 Okano et al. .............. 324/530

FOREIGN PATENT DOCUMENTS

JP 9-264919 10/1997

OTHER PUBLICATIONS

Patent Abstract of Japan, Publication No. 2000–131393, dated May 12, 2000. See PCT search report.

* cited by examiner

*Primary Examiner*—Evan Pert
*Assistant Examiner*—Jermele Hollington
(74) *Attorney, Agent, or Firm*—Westerman, Hattori, Daniels & Adrian, LLP

(57) ABSTRACT

The present invention provides an apparatus and method for inspecting a circuit board at a high speed. An LCD driver module 100 as an object to be inspected has an onboard LCD driving LSI 110. One circuit-wiring group 111 is connected to SEG terminals, and another circuit-wiring group 112 is connected to COM terminals of the LSI 110. An inspection apparatus 1 generates an LSI drive signal and sends it to input terminals 113 of the LSI 110. A pair of sensors 2, 3 are positioned opposedly to the circuit-wiring groups 111, 112, respectively, in a non-contact manner. Each of the sensors 2, 3 detects voltage changes in the corresponding circuit-wiring group 111, 112 caused by driving the LSI 110, and the detected signals are analyzed by the inspection apparatus 1.

27 Claims, 8 Drawing Sheets

INSPECTING APPARATUS AND INSPECTING METHOD FOR CIRCUIT BOARD

TECHNICAL FIELD

The present invention relates to an apparatus and a method for inspecting a circuit board.

BACKGROUND ART

In manufacturing processes of a circuit board, after forming circuit wirings on a board, it is required to inspect the presence of a disconnection or open circuit in the circuit wirings.

Heretofore, an open circuit state in circuit wirings on a circuit board has been determined by bringing a pair of pins into contact with two different portions of each circuit wiring and then checking conduction between the positions.

However, in an area of the circuit board, such as the vicinity of an integrated circuit, where the circuit wirings are formed in close proximity to each other, it is difficult to assure a sufficient interval between the pins. On the other hand, a non-contact type inspection method (Japanese Patent Laid-Open Publication No. 09-264919) has been proposed. However, since this inspection method has still been required to bring one pin into contact with each input section of the circuit wirings, it has been suffered from complicated and time-consuming positioning operations when circuit wirings such as those around an integrated circuit are in close proximity to each other and each of the circuit wirings has a short length.

In view of the problems in the above conventional methods, it is therefore an object of the present invention to provide an apparatus and a method capable of inspecting a circuit board at a high speed.

DISCLOSURE OF THE INVENTION

In order to achieve the above object, according to a first aspect of the present invention, there is provided an apparatus for inspecting a circuit board incorporating an integrated circuit, comprising: drive means for forcibly driving the integrated circuit to generate output signals sequentially from a plurality of output terminals of the integrated circuit; detect means for detecting in a non-contact manner a voltage change in a plurality of circuit wirings connected to the output terminal; comparison means for comparing the magnitude of the detected voltage change to a given value; and defect determination means for determining a defect in the circuit wirings according to the comparison result in the comparison means.

In the first aspect of the present invention, the detect means may be adapted to generate a waveform representing the voltage change, and when the waveform includes an abnormal waveform, the defect determination means may be operable to identify defective one or ones of the plurality of circuit wirings according to the location of the abnormal waveform on a time axis.

The detect means may include a sensor board opposed to the plurality of circuit wirings in a non-contact manner to detect the voltage change any one part of the plurality of circuit wiring. Further, the sensor board may include a single metal plate which has a dimension arranged to cover the plurality of circuit wirings and includes a single output terminal.

The plurality of circuit wirings may be driven to sequentially generate pulse signals as the output signals. In this case, the detect means may be operable to sequentially differentiate the pulse signals and add the differential values to present the sum as a single output waveform representing the voltage change.

The determination means may be operable, responsive to the comparison result in the comparison means indicating that the magnitude of the voltage change is equal to or less than the given value, to determine that the circuit wiring corresponding to the voltage change includes a disconnection.

According to a second aspect of the present invention, there is provided an apparatus for inspecting a circuit board for use in an LCD driver, comprising: detect means for detecting in a non-contact manner a voltage change in all of circuit wirings connected in a one-on-one arrangement to terminals of an LSI for use in an LCD driver; determination means for determining whether or not the magnitude of the detected voltage change is normal or abnormal; and identification means responsive to the determination of an abnormality in the voltage change to identify defective one or ones of the circuit wirings according to the timing of occurrence of said abnormal voltage change.

In the second aspect of the present invention, the apparatus may further include drive means for forcibly driving the LSI to generate output signals sequentially from the terminals of the LSI.

The terminals may be segment terminals. In this case, the determination means may be operable responsive to the voltage change less than a given value to determine that the circuit wiring corresponding to the voltage change includes a disconnection.

Alternatively, the terminals may be common terminals. In this case, the determination means may be operable responsive to the voltage change greater than a given value to determine that the circuit wiring corresponding to the voltage change includes a disconnection.

The determination means may be operable responsive to the voltage change greater than a given value to determine that the circuit wiring corresponding to the voltage change includes a short-circuit.

The timing of occurrence of said abnormal voltage change may be defined by a location on a time axis between adjacent timings of frame inversion detected as periodical major voltage changes in the detect means.

In order to achieve the above object, according to a third aspect of the present invention, there is provided a method for inspecting a circuit board incorporating an integrated circuit, comprising the steps of: forcibly driving the integrated circuit to generate output signals sequentially from a plurality of output terminals of the integrated circuit; detecting in a non-contact manner a voltage change in a plurality of circuit wirings connected to the output terminal; comparing the magnitude of the detected voltage change to a given value; and determining a defect in the circuit wirings according to the comparison result in the comparing step.

In the third aspect of the present invention, the detecting step may include the step of generating a waveform representing the voltage change, and the defect determination step may include the step of when the waveform includes an abnormal waveform, identifying defective one or ones of the plurality of circuit wirings according to the location of the abnormal waveform on a time axis.

The detection step may include the step of positioning a sensor board opposedly to the plurality of circuit wirings in a non-contact manner to detect the voltage change in any one part of the plurality of circuit wiring. In this case, the sensor board may include a single metal plate having a dimension arranged to cover the plurality of circuit wirings, the metal plate including a single output terminal.

The driving step may include the step of forcibly driving the plurality of circuit wirings to sequentially generate pulse signals as the output signals, and the detecting step may include the step of sequentially differentiate the pulse signals and add the adjacent differential values to present the sum as a single output waveform representing the voltage change.

The determining step may include the step of responsive to the comparison result in the comparing step indicating that the magnitude of the voltage change is equal to or less than the given value, determining that the circuit wiring corresponding to the voltage change includes a disconnection.

According to a fourth aspect of the present invention, there is provided a method for inspecting a circuit board for use in an LCD driver, comprising the steps of: incorporating in the circuit board an LSI for use in an LCD driver; forcibly driving the LSI to generate output signals sequentially from all of circuit wirings connected in a one-on-one arrangement to terminals of the LSI; detecting a voltage change in the circuit wirings in a non-contact manner; determining if the magnitude of the detected voltage change is normal; and responsive to the determination of an abnormality in the voltage change, identifying defective one or ones of the circuit wirings according to the timing of occurrence of said abnormal voltage change.

In the fourth aspect of the present invention, the terminals may be segment terminals. In this case, the determining step may include the step of responsive to the voltage change less than a given value, determining that the circuit wiring corresponding to the voltage change includes a disconnection.

Alternatively, the terminals may be common terminals. In this case, the determining step may include the step of responsive to the voltage change greater than a given value, determining that the circuit wiring corresponding to the voltage change includes a disconnection.

The determining step may include the step of responsive to the voltage change greater than a given value, determining that the circuit wiring corresponding to the voltage change includes a short-circuit.

The timing of occurrence of said abnormal voltage change is defined by a location on a time axis between adjacent timings of frame inversion detected as periodical major voltage changes in the detecting step.

DESCRIPTION OF THE PREFERRED EMBODIMENT

With reference to the drawings, the present invention will now be described in detail in conjunction with a preferred embodiment intended simply to show as an example. Therefore, the present invention is not limited to any arrangement, numerical values and others of elements or components described in this embodiment unless otherwise specified.

(Embodiment)

As one embodiment of the present invention, a system for inspecting a circuit board incorporating an integrated circuit will be described below.

<Construction of Inspection System>

Figure 1:
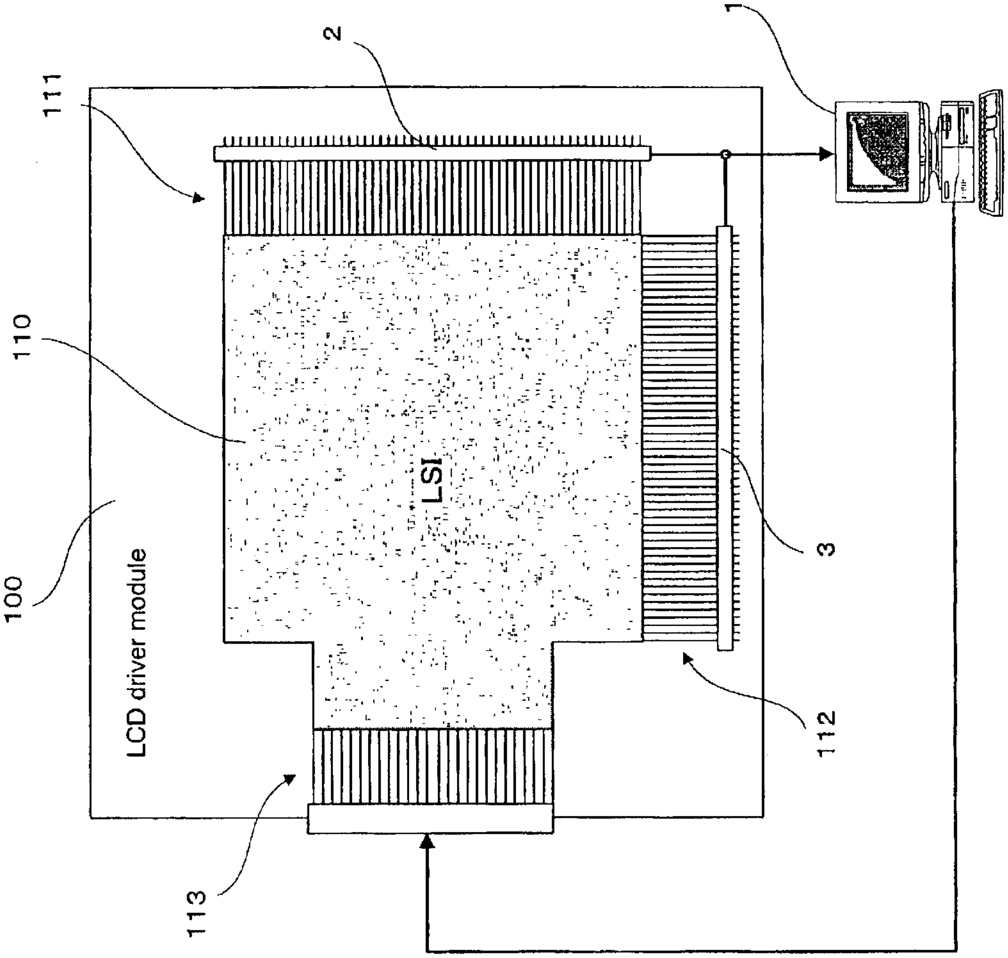
FIG. 1 is a schematic diagram showing the entire construction of an inspection system according to one embodiment of the present invention.

FIG. 1 is schematic diagram showing the inspection system in an inspection operation of a circuit board 100.

A liquid crystal display (LCD) driver module 100 as an object to be inspection has an onboard LCD driving LSI 110. A plurality of first circuit wirings 111 (hereinafter referred to as "SEG circuit-wiring group") printed on the circuit board are connected to a plurality of segment (SEG) terminals of the LSI 110, respectively. A plurality of second circuit wirings 112 (hereinafter referred to as "COM circuit-wiring group") are connected to a plurality of common (COM) terminals of the LSI 110, respectively. Further, a plurality of third circuit wirings 113 are connected to a plurality of input terminals of the LSI 110, respectively.

The inspection system comprises an inspection apparatus 1 composed of a computer, an SEG sensor 2, and a COM sensor 3. The inspection apparatus 1 is a general-purpose computer incorporating an LCD driving program, a circuit and program for analyzing a detected signal from each of the sensors, an interface for allowing communication between the sensors and the LCD driver module, and others.

The inspection apparatus 1 generates an LSI drive signal and sends it to the input terminals 113 of the LSI 110. Voltage changes in each of the SEG and COM circuit-wiring groups 111 and 112 caused by the LSI drive signal are detected by the sensors 2, 3, and then the signals detected by the sensors 2, 3 are analyzed in the inspection apparatus 1.

The sensors 2, 3 are positioned opposedly to the SEG and COM circuit-wiring groups 111, 112, respectively, in a non-contact manner. The sensors 2, 3 detect the voltage changes in the SEG and COM circuit-wiring groups 111, 112 caused by driving the LSI 110, and sends them to the inspection apparatus 1 as detected signals. While the distance between each of the sensors and the corresponding circuit-wiring group is desired to be 0.05 mm or less, the voltage changes can be detected as long as the distance is set in 0.5 mm or less. The sensors may be closely placed on the circuit board with interposing a dielectric insulating material therebetween.

Figure 2:
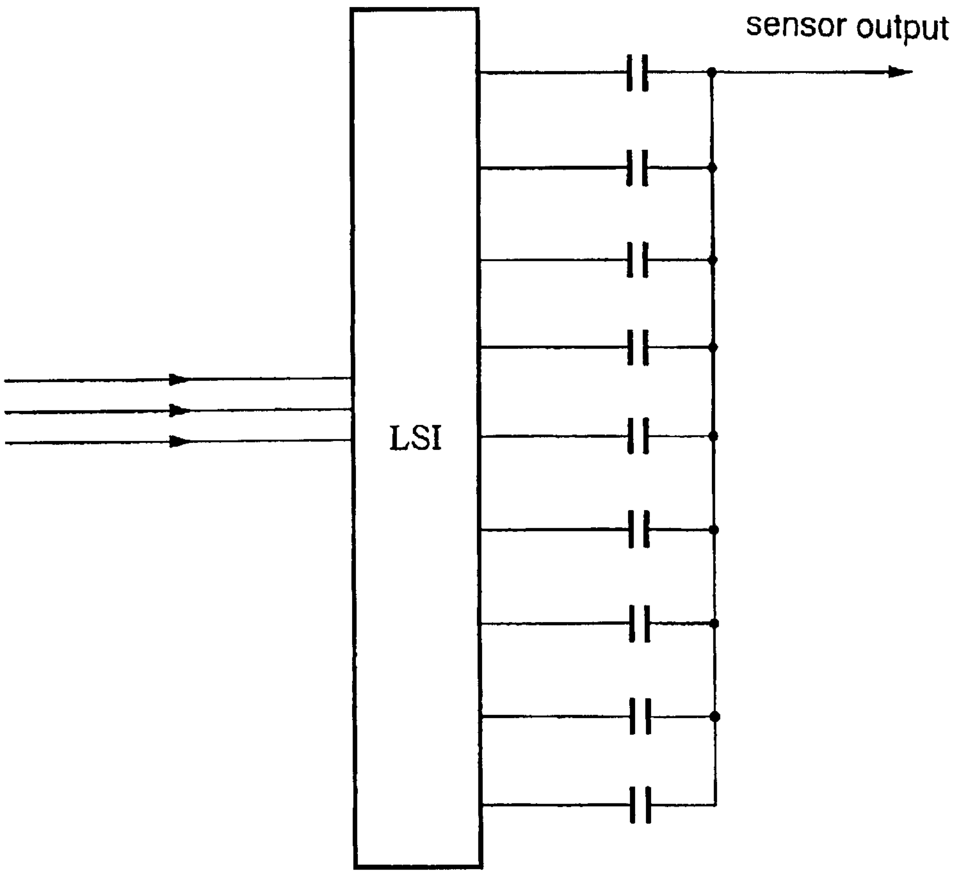
FIG. 2 illustrates an equivalent circuit of a sensor, LSI and circuit wirings in the inspection system according to the embodiment of the present invention.

FIG. 2 shows an equivalent circuit showing the relationship of one of the sensors, the LSI and the corresponding circuit-wiring group. As illustrated, it can be assumed that the sensor is connected with the LSI through a plurality of capacitive couplings. Thus, pulse waves from the LSI are converted into differential waves on a side of the sensor, and then these differential waves are received by the sensor as a detected signal.

Figure 3:
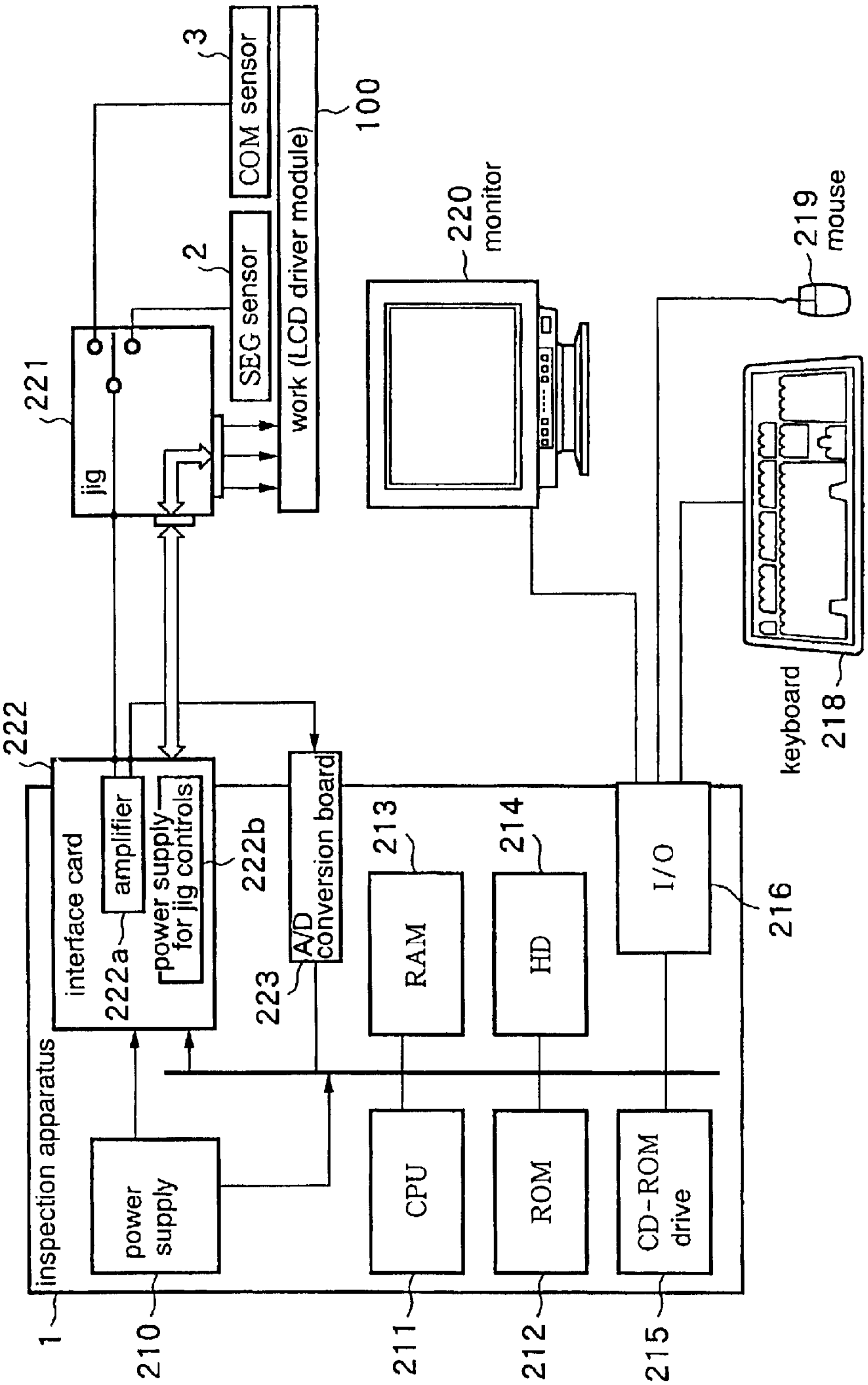
FIG. 3 is a block diagram mainly showing the internal construction of the inspection apparatus of the inspection system according to the embodiment of the present invention.

With reference to FIG. 3, the internal construction of the inspection apparatus 1 will be described below. FIG. 3 is a block diagram showing the hardware of the inspection apparatus 1.

The reference numeral 210 indicates a power supply for supplying a power to the entire inspection apparatus 1, the reference numeral 211 indicating a CPU for performing various operations and controlling the entire inspection apparatus 1, and the reference numeral 212 indicating a ROM for storing programs executed in the CPU 211, fixed values or the like, the reference numeral 213 indicating a RAM as a temporary memory. The RAM includes a program loading area for storing loaded programs, a memory area for digital signals received from the sensors, and others.

The reference numeral 214 indicates a hard disk (HD) as an external memory. The reference numeral 215 indicates a CD-ROM drive as a read device for a detachable storage medium.

The reference numeral 216 indicates an input/output interface. The inspection apparatus sends and receives signals to/from a keyboard 218 as an input device, a mouse 219 and a monitor 220 through the input/output interface 216.

A jig 221 sends signals to the LCD driver module as a work, and switches the SEG sensor and the COM sensor. The computer as the inspection apparatus 1 is expanded to have compatibility for inspecting the LCD driver module, and an interface card 222 and an A/D conversion board 223 are incorporated therein. The interface card 222 contains an amplifier 222*a*. Thus, the detected signal from each of the sensors is amplified by the amplifier, and then sent to the A/D conversion board 223. The interface card 222 further includes a power supply 222*b* for jig controls. This is a booster operable to vary its supply voltage when the work includes a short circuit.

Various programs such as an LCD-driver control program, jig control program and detected signal analysis program are stored in the HD 214, and each program is loaded on the program loading area of the RAM 213 and executed. An image data (CAD data) representing each shape of circuit wirings in design is also stored in the HD 214.

The LCD and/or jig control programs may be installed by reading a CD-ROM with the CD-ROM drive. Otherwise, these programs may be read from other medium such as a FD or DVD, or may be downloaded via networks.

Each of the sensors 2, 3 is made of a conductive material including metals such as aluminum or copper, and semiconductors. Preferably, each of the sensors 2, 3 has a dimension capable of covering all of the circuit wirings or the circuit-wiring groups.

While FIG. 3 shows one mode in which the single inspection apparatus 1 is connected to the single jig to inspect the single work, a plurality of interface cards may be incorporated in a single inspection apparatus to simultaneously inspect a plurality of works.

Figure 4:
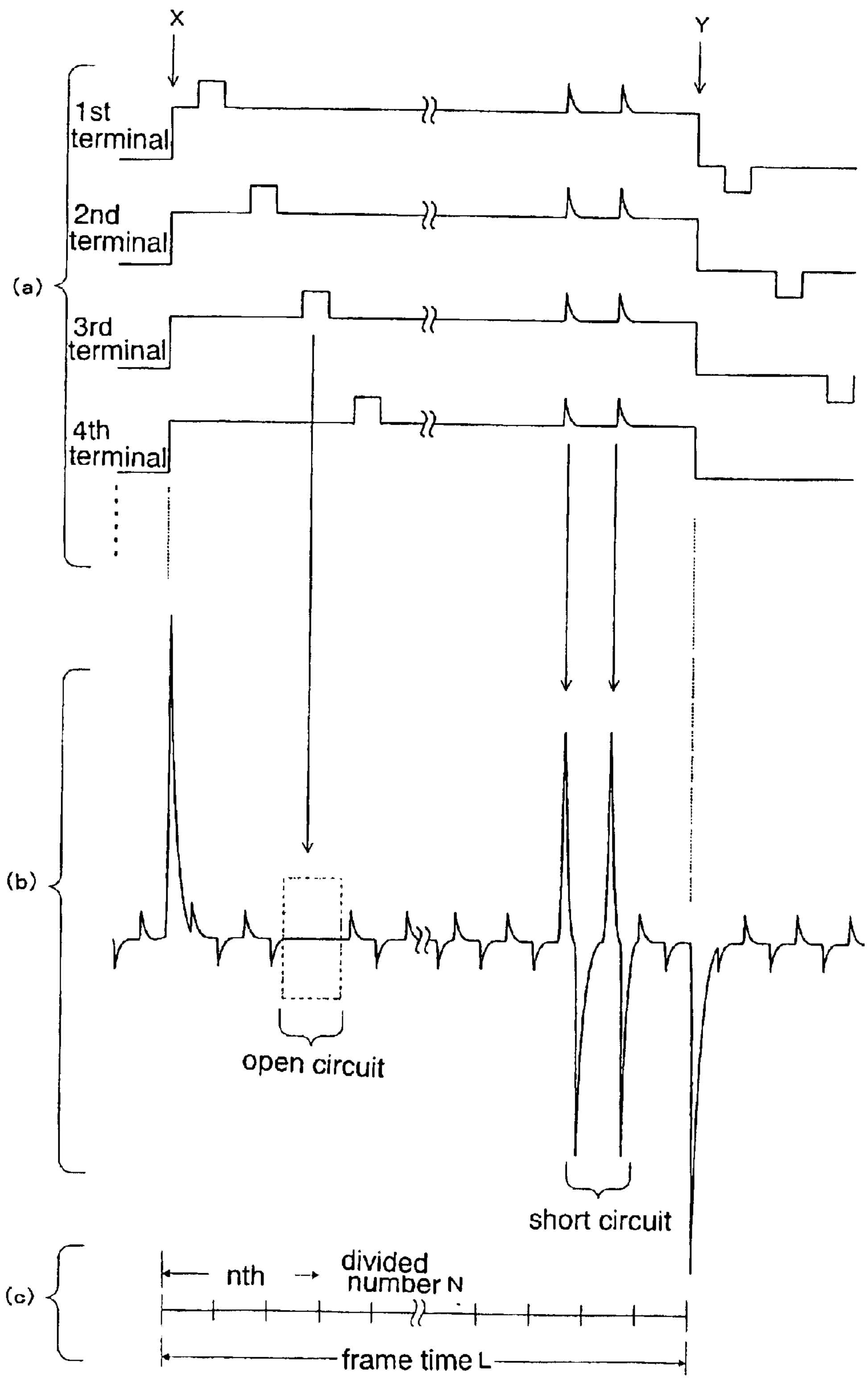
FIG. 4 is an explanatory diagram of a method for inspecting a circuit board on the side of SEG terminals by use of the inspection apparatus according to the embodiment of the present invention.

With reference to FIG. 4, a method for detecting defects in the SEG circuit-wiring group will be described below.

The LSI is forcedly driven so that its 1st to N-th terminals provide output pulse signals as shown in FIG. 4(*a*). Each point designated by the arrows X and Y is the timing for switching frames, and each of the output waveforms from the terminals is reversed.

The pulse signals as shown in FIG. 4(*a*) are detected by the sensor 2, and differentiated and added. The resulting sum forms a waveform as a detected signal having a shape as shown in FIG. 4(*b*). As illustrated, at the timings X, Y for switching frames, each voltage in all of the terminals raises or turns down simultaneously to generate a relatively high peak periodically. One frame period of time can be determined by detecting these adjacent frame-switching points and counting the lapsed time between the two points. As shown in FIG. 4(*c*), by checking the output signal of the sensor around a value n L/N derived from dividing the frame time L by the number of the terminals N and multiplying the resulting quotient by a positive integer n, where n is equal to or less than the number of the terminals N.

For example, in FIG. 4, despite of existence of an output pulse signal from the 3rd terminal as shown in FIG. 4(*a*), no deferential waveform is detected in the sensor output or detected signal as shown in FIG. 4(*b*). Thus, it can be determined that the circuit wiring connected to the 3rd terminal includes a disconnection, and thereby no voltage change is caused at the corresponding position of the sensor. Further, if some circuit wirings include a short circuit therebetween, voltage in the booster circuit is varied by driving the terminal connected to this circuit wiring, and then voltage changes are caused in all of the terminals. This leads to a significant disorder in the sensor output waveform. FIG. 4(*b*) shows that the two circuit wirings connected to the N-1-th and N-2-th terminals are short-circuited mutually.

Figure 5:
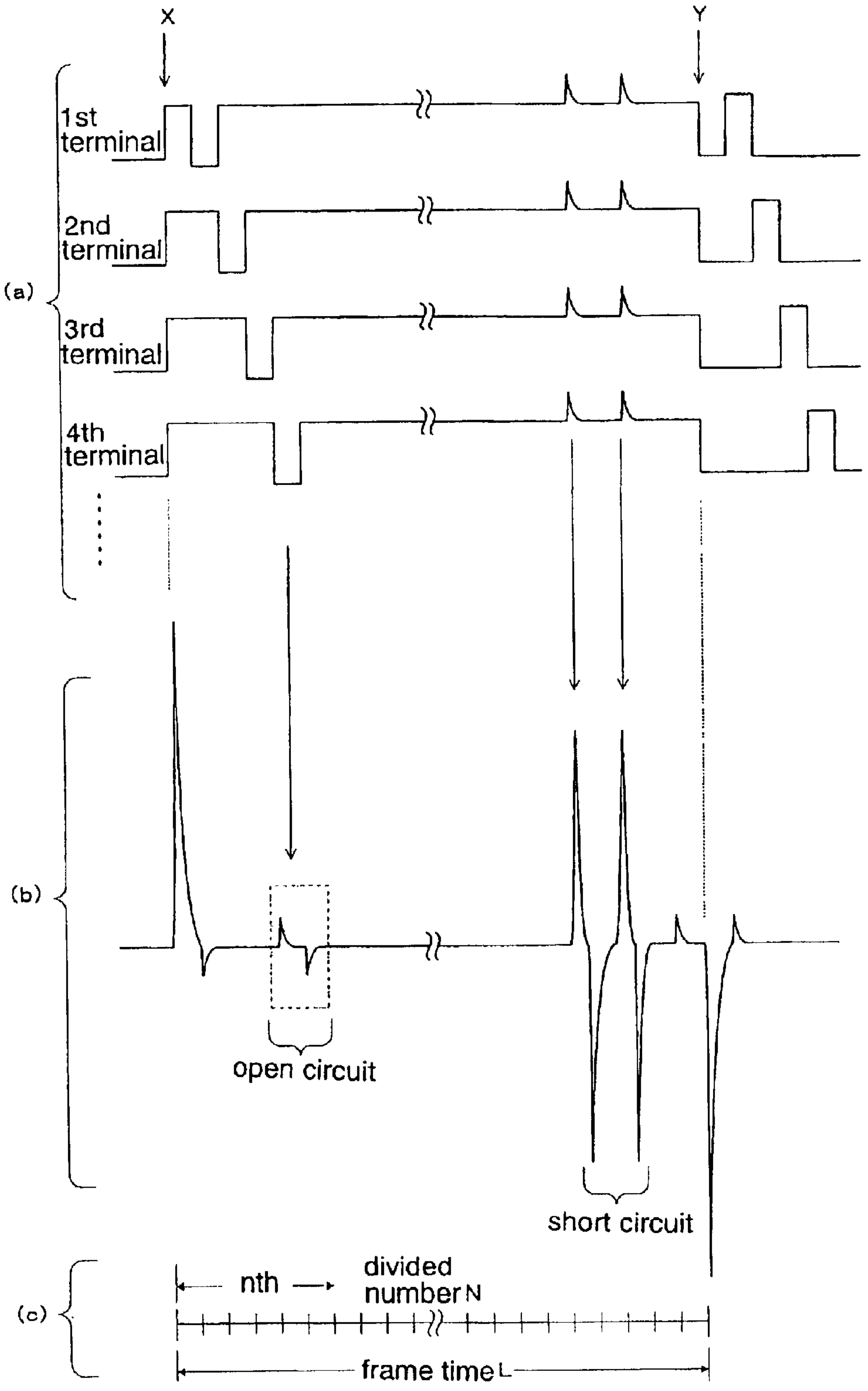
FIG. 5 is an explanatory diagram of a method for inspecting the circuit board on the side of COM terminals by use of the inspection apparatus according to the embodiment of the present invention.

With reference to FIG. 5, a method for detecting defects in the COM circuit-wiring group will be described below.

Differently from the SEG terminals, the COM terminals are turned on and off in a sequential order during a regular LCD drive. Thus, the COM terminals are driven in the ordinary way without any additional particular control. However, by the ordinary way, the timing of turn-off in one of the terminals is simultaneous with the timing of turn-on in adjacent one, as shown in FIG. 5(*a*). Thus, if no defect, at any one of the timing, the differential value representing a voltage change in one of the circuit wirings has the same magnitude as but the reverse sign to that in adjacent one. That is, in a normal state free from any defect, the sensor output waveform formed by adding respective differential values of all of the terminals will have a flat shape. As shown in FIG. 5(*b*), only if one circuit wiring in the circuit group includes a disconnection, two circuit wirings connected to the terminals on both sides of the terminal of the circuit wiring including the disconnection have turn-on and turn-off waveforms, respectively.

As in the SEG terminals, a relatively high peak is generated at each of the frame switching timings X and Y. Further, disconnection and short circuit in the circuit wiring connected to the n-th COM terminal can be detected based on the frame time L and the number of the terminals.

Fir example, in the sensor output as shown in FIG. 5(*a*), a differential waveform is detected at the 4th position in the divided times. That is, it can be determined that the circuit wiring connected to the 4th terminal includes a disconnection, and thereby no voltage change is caused at the corresponding position of the sensor. Further, the waveform of a short circuit is the same as that in the SEG terminals. That is, if one circuit wiring in the circuit-wiring group includes a short circuit, voltage in the booster circuit is varied by driving the terminal connected to this circuit wiring, and then voltage changes are caused in all of the terminals. This leads to a significant disorder in the sensor output waveform. FIG. 5(*b*) shows that the two circuit wirings connected to the N-1-th and N-2-th terminals are short-circuited mutually.

Figure 6:
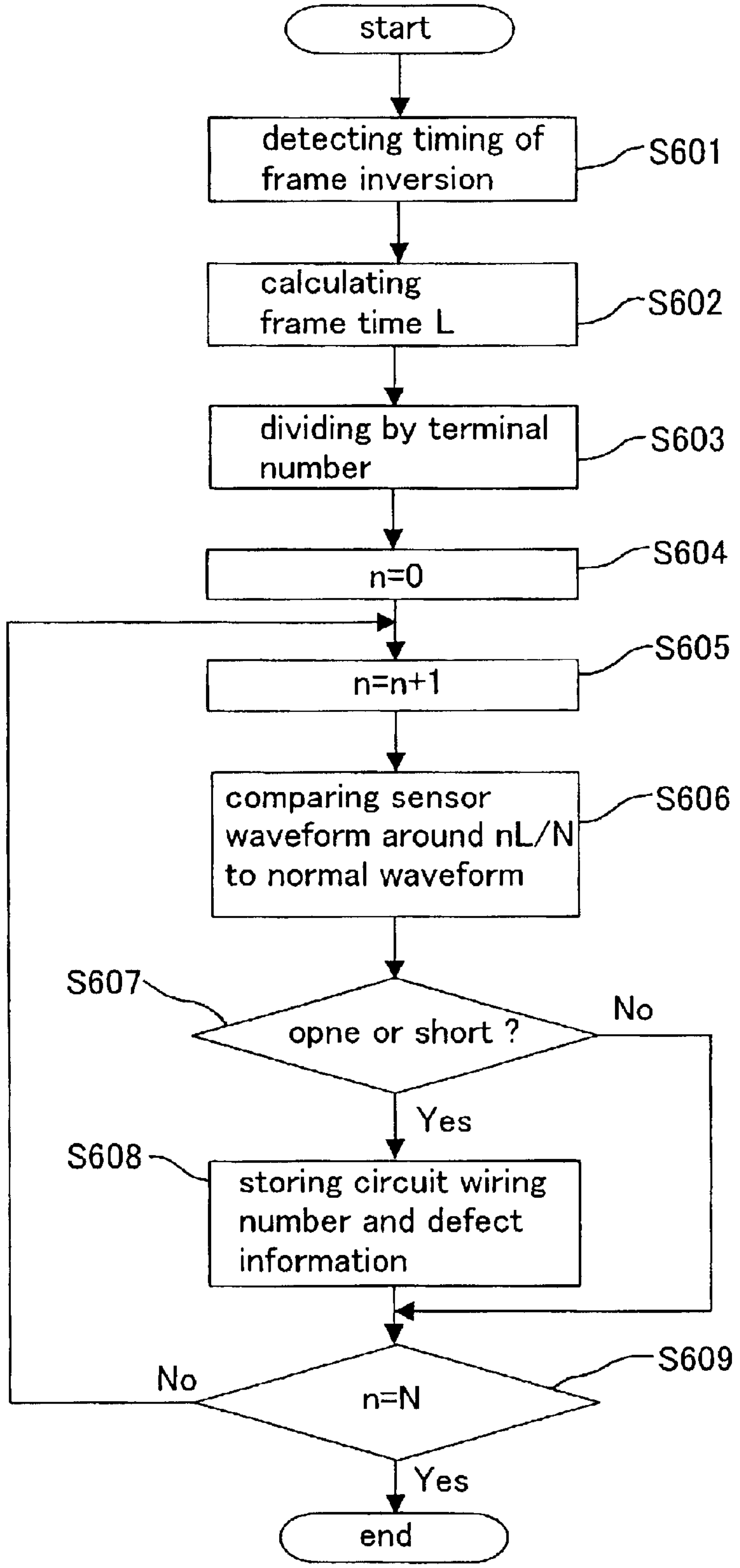
FIG. 6 is a flow chart of the inspection method according to the embodiment of the present invention.

With reference to the flowchart of FIG. 6, the processing flow in the inspection operation will be described below.

In Step S-610, each position of frame inversions on a time axis is first detected. This can be achieved by detecting peaks each appears approximately periodically and equal to or greater than a given value. In Step S-602, the period of time between the peaks of the frame inversions is then measured to determine a frame time.

In Step S-603, L/N is derived from dividing the frame time L by the number of the terminals N. After initializing the terminal number n in Step S-604, n is incremented in Step S-605, and n L/N is calculated to specify a range on the time axis in which the voltage of the circuit wiring connected to the n-th terminals is to be detected. By comparing the sensor output waveform falling within in the range to a normal sensor output waveform or comparing a threshold derived from the normal sensor output waveform to a peak of the actual output, it is detected whether voltage change is caused in the n-th circuit wiring. More specifically, in the inspection operation of the SEG circuit-wiring group, when the peak of the actual output is equal to or less than a certain threshold, it is determined that the circuit wiring includes a disconnection. Further, when the peak of the actual output is equal to or less than another threshold, it is determined that the circuit wiring includes a short circuit. In the inspection operation of the COM circuit-wiring group, when the peak of the actual output is equal to or greater than a certain threshold, it is determined that the circuit wiring includes a disconnection. Further, when the peak of the actual output is equal to or greater than another threshold greater than the certain threshold, it is determined that the circuit wiring include a short circuit.

If one of disconnection and short circuit is determined in Step S-606, the process proceeds from Step S-607 to Step S-608, and the circuit wiring number n and its determined defect are recorded. In Step S-609, n is then compared to N in order to determine if the inspection operation for the entire circuit-wiring groups is completed. If n is less than N, the process returns to Step S-605. After n is incremented, the processing in Step S-606 to Step S-608 will be repeated. When n is equal to N, the completion of the inspection operation for the entire circuit-wiring groups is determined, and the processing is terminated.

When it is required to remove a defective circuit board even if only one defect is included in circuit wirings of the circuit board, in response to YES in Step S-607, the defect of the circuit board is notified to a user, and then the processing of this circuit board may be terminated without completing the inspection operation for the entire circuit-wiring groups. Otherwise, without the storing process in Step S-608, the defect of the circuit board may be simply notified to a user.

As above, in the inspection system according to this embodiment, disconnection and/or short circuit in the circuit board having the onboard LCD driving LSI as an integrated circuit are detected in a non-contact manner. Thus, even if highly fine circuit patterns are introduced in the market, it is unnecessary to prepare mechanisms and spend much time for troublesome positioning operations. Further, the jig is not damaged and desired automatic mechanization can be facilitated because any probe is not used in the inspection system.

In addition, the inspection system according to this embodiment can inspect a circuit board having an onboard LSI. In the same state, the LSI itself can also be inspected (an inspection of current consumption during operation, an inspection and measurement of voltage, an inspection of frame frequency or the like), and thereby the time for inspecting the entire LSD driver module can be remarkably reduced.

While the inspection system according to this embodiment detects voltage changes in the circuit wirings, the quantity and radiative configuration of an electromagnetic wave emitted from the circuit board may be detected. When the electromagnetic wave has a given quantity and configuration, it is determined that the circuit wiring has a normal continuity. If the electromagnetic wave has a quantity less than a give value and a configuration different from a given criterion, it is determined that the circuit wiring has a defect.

EXAMPLE

Figure 7:
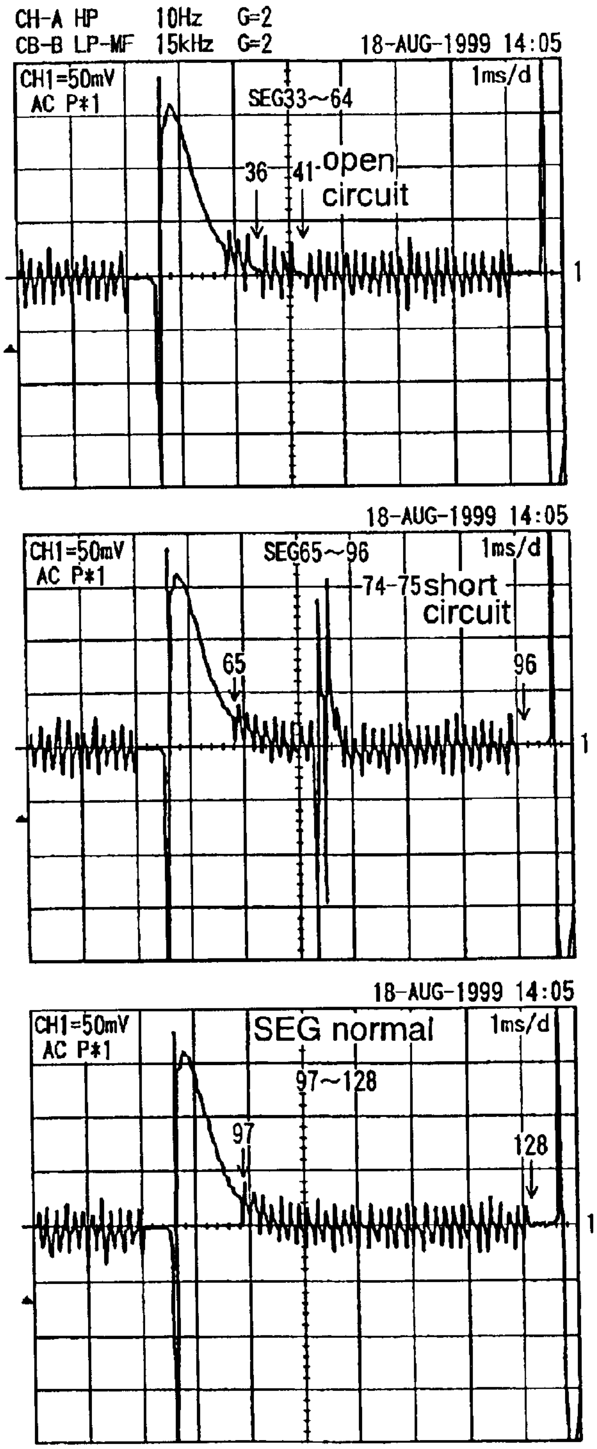
FIG. 7 illustrates an actual waveform detected by the inspection system according to the embodiment of the present invention.
Figure 8:
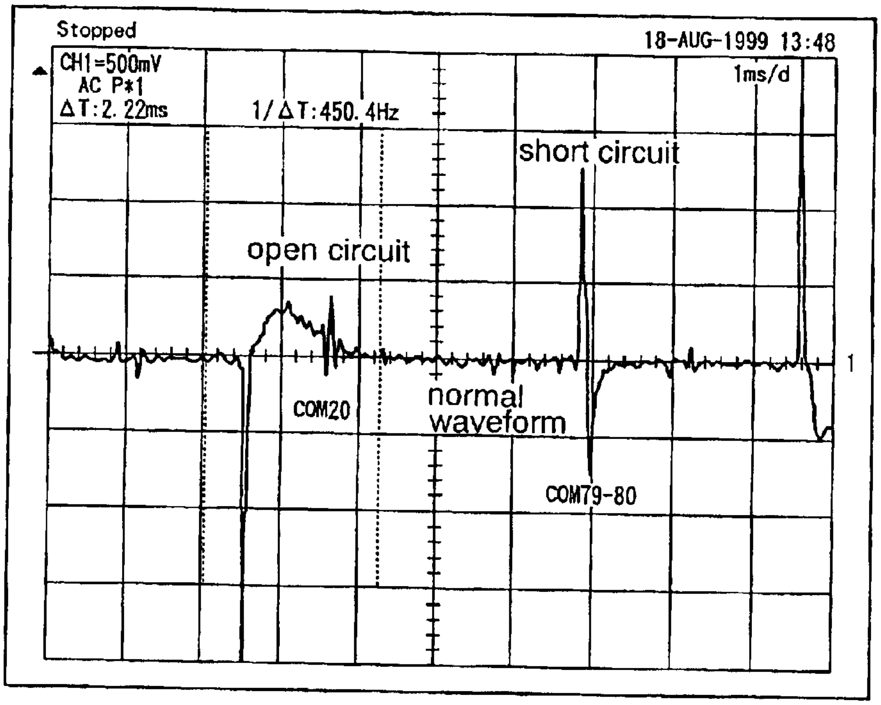
FIG. 8 illustrates an actual waveform detected by the inspection system according to the embodiment of the present invention.

For the purpose of reference, actual sensor output waveforms are shown in FIGS. 7 and 8. FIGS. 7 and 8 show detect waveforms on the side of the SEG and COM terminals, respectively.

These data was measured by driving a work having a number 80 of COM terminals and a number 128 of SEG terminals and sampling waveforms using frame outputs as triggers. In particular, the SEG terminals were sequentially driven in units of 32 terminals to generate output signals with skipping two terminals so as to determine the outputs of the SEG terminals independently.

As a result, in case of a total number 250 of the SEG and COM terminals, a single work could be inspected within 1.5 to 3 seconds, and four works arranged in parallel with each other could be inspected within 3 to 7 seconds.

INDUSTRIAL APPLICABILITY

The present invention can provide an apparatus and method for inspecting a circuit board at a high speed.

What is claimed is:

1. An apparatus for inspecting a circuit board incorporating an integrated circuit, comprising:

drive means for forcibly driving said integrated circuit to generate output signals sequentially from a plurality of output terminals of said integrated circuit;

detect means for detecting in a non-contact manner a voltage change in a plurality of circuit wirings connected to said output terminals;

comparison means for comparing the magnitude of the detected voltage change to a given value; and defect determination means for determining a defect in said circuit wirings according to the comparison result in said comparison means.

2. An apparatus as defined in claim 1, wherein said output signals are pulse waves.

3. An apparatus as defined in claim 2, wherein said detect means is adapted to generate a waveform representing the voltage change, and wherein when said waveform includes an abnormal waveform, said defect determination means is operable to identify defective one or ones of said plurality of circuit wirings according to the location of said abnormal waveform on a time axis.

4. An apparatus as defined in claim 2, wherein said detect means includes a sensor board opposed to said plurality of circuit wirings in a non-contact manner to detect the voltage change in any one part of said plurality of circuit wiring.

5. An apparatus as defined in claim 4, wherein said sensor board includes a single metal plate having a dimension arranged to cover said plurality of circuit wirings, said metal plate including a single output terminal.

6. An apparatus as defined in claim 2, wherein said plurality of circuit wirings are driven to sequentially generate pulse signals as said output signals, and wherein said detect means is operable to sequentially differentiate the pulse signals and add the differential values to present the sum as a single output waveform representing the voltage change.

7. An apparatus as defined in claim 2, wherein responsive to the comparison result in said comparison means indicating that the magnitude of the voltage change is equal to or less than said given value, said determination means is operable to determine that the circuit wiring corresponding to said voltage change includes a disconnection.

8. An apparatus for inspecting a circuit board for use in an LCD driver, comprising:

detect means for detecting in a non-contact manner a voltage change in all of circuit wirings connected in a one-on-one arrangement to terminals of an LSI for use in an LCD driver;

determination means for determining whether or not the magnitude of the detected voltage change is normal or abnormal; and identification means responsive to the determination of an abnormality in the voltage change to identify defective one or ones of said circuit wirings according to the timing of occurrence of said abnormal voltage change.

9. An apparatus as defined in claim 8, wherein said voltage change is detected as a pulse wave.

10. An apparatus as defined in claim 9, which further includes drive means for forcibly driving said LSI to generate output signals sequentially from said terminals of said LSI.

11. An apparatus as defined in claim 9, wherein said terminals are segment terminals, and wherein said determination means is operable responsive to the voltage change less than a given value to determine that the circuit wiring corresponding to said voltage change includes a disconnection.

12. An apparatus as defined in claim 9, wherein said terminals are common terminals, and wherein said determination means is operable responsive to the voltage change greater than a given value to determine that the circuit wiring corresponding to said voltage change includes a disconnection.

13. An apparatus as defined in claim 9, wherein said determination means is operable responsive to the voltage change greater than a given value to determine that the circuit wiring corresponding to said voltage change includes a short-circuit.

14. An apparatus as defined in claim 9, wherein said timing of the occurrence of said abnormal voltage change is defined by a location on a time axis between adjacent timings of frame inversion detected as periodical major voltage changes in said detect means.

15. A method for inspecting a circuit board incorporating an integrated circuit, comprising the steps of:

forcibly driving said integrated circuit to generate output signals sequentially from a plurality of output terminals of said integrated circuit;

detecting in a non-contact manner a voltage change in a plurality of circuit wirings connected to said output terminal;

comparing the magnitude of the detected voltage change to a given value; and determining a defect in said circuit wirings according to the comparison result in said comparing step.

16. An apparatus as defined in claim 15, wherein said output signals are pulse waves.

17. A method as defined in claim 16, wherein said detecting step includes the step of generating a waveform representing the voltage change, and wherein said defect determination step includes the step of when said waveform includes an abnormal waveform, identifying defective one or ones of said plurality of circuit wirings according to the location of said abnormal waveform on a time axis.

18. A method as defined in claim 16, wherein said detection step includes the step of positioning a sensor board opposedly to said plurality of circuit wirings in a non-contact manner to detect the voltage change in any one part of said plurality of circuit wiring.

19. A method as defined in claim 18, wherein said sensor board includes a single metal plate having a dimension arranged to cover said plurality of circuit wirings, said metal plate including a single output terminal.

20. A method as defined in claim 16, wherein said driving step includes the step of forcibly driving said plurality of circuit wirings to sequentially generate pulse signals as said output signals, and wherein said detecting step includes the step of sequentially differentiate the pulse signals and add the differential values to present the sum as a single output waveform representing the voltage change.

21. A method as defined in claim 16, wherein said determining step includes the step of responsive to the comparison result in said comparing step indicating that the magnitude of the voltage change is equal to or less than said given value, determining that the circuit wiring corresponding to said voltage change includes a disconnection.

22. A method for inspecting a circuit board for use in an LCD driver, comprising the steps of:

incorporating in said circuit board an LSI for use in an LCD driver;

forcibly driving said LSI to generate output signals sequentially from all of circuit wirings connected in a one-on-one arrangement to terminals of said LSI;

detecting a voltage change in said circuit wirings in a non-contact manner;

determining whether or not the magnitude of the detected voltage change is normal; and responsive to the determination of an abnormality in the voltage change, identifying defective one or ones of said circuit wirings according to the timing of said determination.

23. An apparatus as defined in claim 22, wherein said output signals are pulse waves.

24. A method as defined in claim 23, wherein said terminals are segment terminals, and wherein said determining step includes the step of responsive to the voltage change less than a given value, determining that the circuit wiring corresponding to said voltage change includes a disconnection.

25. A method as defined in claim 23, wherein said terminals are common terminals, wherein said determining step includes the step of responsive to the voltage change greater than a given value, determining that the circuit wiring corresponding to said voltage change includes a disconnection.

26. A method as defined in claim 23, wherein said determining step includes the step of responsive to the voltage change greater than a given value, determining that the circuit wiring corresponding to said voltage change includes a short-circuit.

27. A method as defined in claim 23, wherein said timing of occurrence of said abnormal voltage change is defined by a location on a time axis between adjacent timings of frame inversion detected as periodical major voltage changes in said detecting step.

* * * * *